(12) United States Patent
Kobayashi

(10) Patent No.: US 9,807,909 B1
(45) Date of Patent: Oct. 31, 2017

(54) SOCKET FOR ELECTRIC COMPONENT

(71) Applicant: ENPLAS CORPORATION, Kawaguchi-shi, Saitama (JP)

(72) Inventor: Shin Kobayashi, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 15/506,540

(22) PCT Filed: Aug. 27, 2015

(86) PCT No.: PCT/JP2015/074156
§ 371 (c)(1),
(2) Date: Feb. 24, 2017

(87) PCT Pub. No.: WO2016/035658
PCT Pub. Date: Mar. 10, 2016

(30) Foreign Application Priority Data

Sep. 1, 2014 (JP) .................. 2014-177214

(51) Int. Cl.
H05K 7/20 (2006.01)
H05K 7/10 (2006.01)
(Continued)

(52) U.S. Cl.
CPC ........... *H05K 7/2049* (2013.01); *H01L 23/34* (2013.01); *H01R 4/5066* (2013.01); *H01R 12/57* (2013.01);
(Continued)

(58) Field of Classification Search
CPC . H05K 7/2049; H01R 23/6806; H01R 4/5066
See application file for complete search history.

(56) References Cited

U.S. PATENT DOCUMENTS 5,500,556 A * 3/1996 Kosugi ................. H01L 23/433
257/718
5,911,897 A * 6/1999 Hamilton ........... G01R 31/2874
219/209

(Continued)

FOREIGN PATENT DOCUMENTS

JP 3822005 9/2006
JP 2006-308517 11/2006
(Continued)

OTHER PUBLICATIONS

International Search Report dated Nov. 17, 2015 in corresponding International Application No. PCT/JP2015/074156.
(Continued)

*Primary Examiner* — James Harvey
(74) *Attorney, Agent, or Firm* — Staas & Halsey LLP

(57) ABSTRACT

A socket for an electric component includes a socket body in which a contact pin is provided in a housing part and a cover member provided so as to be rotatable with respect to the socket body. The cover member has a cover member body and a heat slug in contact with an electric component. The heat slug is configured so as to move downward and press the electric component by being pressed from above by a cooling head in a state in which the cover member is closed. In a state in which the electric component is housed in the housing part, a restricting mechanism allows the downward movement of the heat slug, whereas in a state in which the electric component is not housed in the housing part, the restricting mechanism prevents the downward movement of the heat slug.

5 Claims, 16 Drawing Sheets

(51) Int. Cl.
*H01R 12/50* (2011.01)
*H01R 13/10* (2006.01)
*H01R 13/627* (2006.01)
*H01R 13/24* (2006.01)
*H01R 12/57* (2011.01)
*H01R 13/635* (2006.01)
*H01R 13/652* (2006.01)
*H01R 4/50* (2006.01)
*H01R 33/76* (2006.01)
*H01L 23/34* (2006.01)

(52) U.S. Cl.
CPC ......... *H01R 13/10* (2013.01); *H01R 13/2407* (2013.01); *H01R 13/6278* (2013.01); *H01R 13/635* (2013.01); *H01R 13/652* (2013.01); *H01R 23/6806* (2013.01); *H01R 33/76* (2013.01); *H05K 7/10* (2013.01)

(56) References Cited

U.S. PATENT DOCUMENTS

| | | | | |
|---|---|---|---|---|
| 6,341,970 B1* | 1/2002 | Ho | ................... | H01R 4/5066 439/266 |
| 6,383,002 B1 | 5/2002 | Ohashi | | |
| 2003/0190832 A1* | 10/2003 | Matsunaga | ........ | G06K 13/0862 439/331 |
| 2007/0030656 A1* | 2/2007 | Ross | ................... | H01L 23/4338 361/710 |
| 2008/0186681 A1* | 8/2008 | Deck | ................... | H01L 23/4006 361/719 |
| 2008/0239678 A1* | 10/2008 | Ploeg | ...................... | H01L 23/40 361/719 |
| 2011/0036538 A1* | 2/2011 | Brunschwiler | ........... | G06F 1/20 165/11.1 |
| 2012/0218712 A1* | 8/2012 | Hayashi | ............... | H05K 7/2049 361/704 |
| 2014/0008504 A1* | 1/2014 | Kottmyer | ............ | H01L 23/4093 248/221.11 |
| 2014/0321064 A1* | 10/2014 | Bose | ................... | H01L 23/4093 361/720 |
| 2017/0125922 A1* | 5/2017 | Palaniappa | ............... | H01R 4/38 |

FOREIGN PATENT DOCUMENTS

| | | |
|---|---|---|
| JP | 2007-78576 | 3/2007 |
| JP | 4942639 | 5/2012 |

OTHER PUBLICATIONS

Written Opinion of the International Searching Authority dated Nov. 17, 2015 in corresponding International Application No. PCT/JP2015/074156.

* cited by examiner

SOCKET FOR ELECTRIC COMPONENT

CROSS-REFERENCE TO RELATED APPLICATIONS

This application is a U.S. National Stage Application, which claims the benefit under 35 U.S.C. §371 of International Patent Application No. PCT/JP2015/074156, filed Aug. 27, 2015, which claims the foreign priority benefit under 35 U.S.C. §119 of Japanese Patent Application No. 2014-177214, filed Sep. 1, 2014, the contents of which are incorporated herein by reference.

TECHNICAL FIELD

The present invention relates to a socket for an electric component electrically connected to an electric component such as a semiconductor device (hereinafter referred to as "IC package").

BACKGROUND ART

As such a type of socket for an electric component, an IC socket is conventionally known in which a contact pin is disposed. This IC socket is designed to be disposed on a wiring circuit board to house an IC package which is an object to be inspected, and a terminal of this IC package and an electrode of the wiring circuit board are electrically connected together via the contact pin to conduct a test such as a conductivity test.

Conventionally, to conduct a test efficiently, a plurality of IC sockets may be arranged side by side, and IC packages may be housed in the respective IC sockets to simultaneously conduct tests on the plurality of IC packages (e.g., see Japanese Patent Laid-Open No. 2007-78576).

Conventionally, a cooling apparatus provided with a cooling head for cooling an IC package may be used to keep an IC package under testing at a predetermined temperature (e.g., see Japanese Patent Laid-Open No. 2007-78576). The IC socket may be provided with a heat slug made of a material with high thermal conductivity, the heat slug may be pressed by the cooling head to move downward, and the heat slug may press the IC package so that the IC package is cooled by the cooling head via the heat slug.

As described above, the apparatus that conducts tests on a plurality of IC packages simultaneously using a plurality of IC sockets is provided with a number of cooling heads for cooling IC packages corresponding to all IC sockets. All the cooling heads press the heat slugs of the corresponding IC sockets, causing them to move downward, the heat slugs press the respective IC packages so as to cool all the IC packages via the heat slugs.

SUMMARY OF INVENTION

Technical Problem

However, as described in Patent Literature 1, when a plurality of IC packages are simultaneously tested using the plurality of IC sockets, depending on the number of IC packages to be tested, some IC packages may not be housed in some IC sockets. Even when the IC packages are not housed in some IC sockets, all the cooling heads operate similarly. For that reason, when the cooling heads press the heat slugs of the IC sockets in which no IC package is housed and the heat slugs are caused to move downward, the heat slugs may directly come into contact with the contact pin because no IC package is housed, causing damage to the contact pin or causing a foreign substance to adhere to the contact part of the contact pin.

It is therefore an object of the present invention to provide a socket for an electric component (e.g., IC socket) having a configuration in which the electric component (e.g., IC package) is cooled by a cooling head via a heat slug, capable of preventing damage of the contact pin or adhesion of a foreign substance to the contact part of the contact pin due to the heat slug.

Solution to Problem

In order to solve the above-described problems, a socket for an electric component according to the present invention includes a socket body which is disposed on a wiring circuit board and provided with a housing part to house an electric component on a top surface of the housing part, a contact pin to electrically connect an electrode of the wiring circuit board and a terminal of the electric component is disposed on the housing part, a cover member disposed so as to be able to open or close with respect to the socket body, wherein, the cover member includes a cover member body and a heat slug disposed on the cover member body and contact with the electric component housed to the housing part in a state in which the cover member is closed, the heat slug is configured to be pressed from above by a cooling head in a state in which the cover member is closed and caused to move downward with respect to the cover member body so as to press the electric component, and the cover member is provided with a restricting mechanism that allows, in a state in which the electric component is housed in the housing part, the cooling head to cause the heat slug to move downward to press the electric component and prevents, in a state in which no electric component is housed in the housing part, the cooling head from causing the heat slug to move downward.

The socket for an electric component of the present invention is preferably configured such that the restricting mechanism is provided with a trigger member disposed on the cover member body so as to be movable with respect to the cover member body, an urging member that urges the trigger member in a first direction to keep the trigger member at a position where the heat slug is allowed to move downward, and a trigger stopper that moves, when the cover member body further moves downward by a predetermined distance from a lowest downward moving position when the electric component is housed in the housing part in a process in which the cover member is closed, the trigger member in a second direction which is opposite to the first direction against an urging force of the urging member to thereby cause the trigger member to prevent the heat slug from moving downward.

The socket for an electric component of the present invention is preferably configured such that the heat slug is provided with a concave part to insert an upper contact part of the trigger member, the trigger stopper is provided with a slope to rotate the trigger member when the trigger stopper comes into contact with a lower contact part of the trigger member, the cover member reaches the lowest downward moving position when the electric component is housed in the housing part, without the lower contact part of the trigger member contacting the slope of the trigger stopper in a state in which the upper contact part faces the concave part, the lower contact part of the trigger member rotates and moves in contact with the slope of the trigger stopper when no electric component is housed in the housing part, and the cover member reaches the lowest downward moving position after the upper contact part reaches a position facing a surface outside a peripheral edge of the concave part.

The socket for an electric component of the present invention is preferably provided with a pusher plate that is provided on an undersurface of the cover member body, comes into contact with a peripheral portion of the electric component from above when the electric component is housed in the housing part, and comes into contact with a top surface of the housing part when no electric component is housed in the housing part, in which the lowest downward moving position of the cover member is defined by the pusher plate.

The socket for an electric component of the present invention is preferably configured such that the housing part is a floating plate disposed so as to be movable upward/downward with respect to the socket body, the floating plate includes a through hole into which a first contact part of the contact pin is inserted, and in a state in which the electric component is housed in the floating plate, when the restricting mechanism moves downward and presses the floating plate, a pressing force thereof causes the floating plate to move downward, the first contact part of the contact pin comes into contact with a terminal of the electric component, then the cooling head presses the heat slug to move downward, the heat slug thereby comes into contact with the electric component, whereas in a state in which no electric component is housed in the floating plate, when the restricting mechanism moves downward and presses the floating plate, the pressing force causes the restricting mechanism to be switched to a state in which the restricting mechanism prevents the heat slug from moving downward, and the restricting mechanism prevents the heat slug from moving downward when the cooling head presses the heat slug so that the heat slug does not come into contact with the first contact part of the contact pin.

Advantageous Effects of Invention

According to the present invention, since the restricting mechanism is provided in the configuration in which the electric component housed in the housing part is pressed by the cooling head via the heat slug, it is possible to allow the heat slug to move downward in a state in which the electric component is housed in the housing part, whereas in a state in which no electric component is housed in the housing part, it is possible to prevent the heat slug from moving downward.

The present invention adopts a configuration in which the restricting mechanism is provided with the trigger member and the urging member and the trigger stopper causes the trigger member to move, and it is thereby possible to prevent, with a simple configuration, the heat slug from moving downward.

According to the present invention, the upper contact part of the trigger member is caused to face the concave part of the heat slug when the electric component is housed in the housing part and the upper contact part of the trigger member is caused to rotate and move to a position deviated from the concave part of the heat slug when no electric component is housed in the housing part, and it is thereby possible to prevent, with a simple configuration, the heat slug from moving downward.

According to the present invention, the lowest downward moving position of the cover member body is changed using the pusher plate depending on whether the electric component is housed in the housing part or not, and it is thereby possible to prevent, with a simple configuration, the heat slug from moving downward.

According to the present invention, when no electric component is housed in the housing part, it is possible to prevent the heat slug from moving downward, thus prevent the heat slug from coming into contact with the first contact part of the contact pin, and thereby prevent the heat slug from damaging the contact pin or prevent a foreign substance from adhering to the contact part of the contact pin.

DESCRIPTION OF EMBODIMENTS

Figure 1:
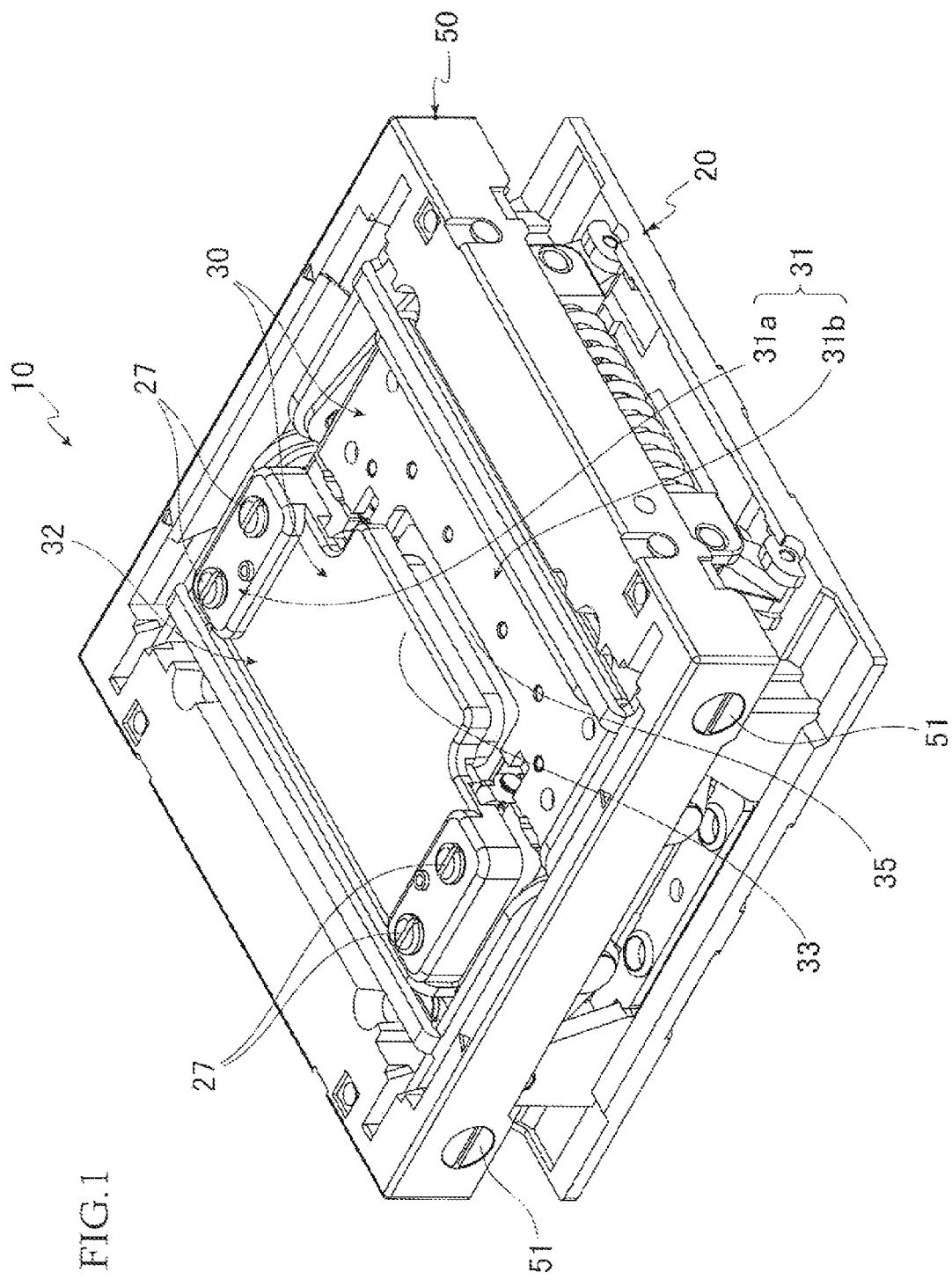
FIG. 1 is a perspective view of an IC socket in a closed state according to an embodiment of the present invention.

Hereinafter, an embodiment of the present invention will be described.

FIG. 1 to FIG. 16 illustrate the embodiment of the present invention.

An IC socket 10 as a "socket for an electric component" according to this embodiment is disposed on a wiring circuit board 1 as shown in each figure, on a top surface of which an IC package 2 is housed as an "electric component" and is configured so as to electrically connect an electrode (not shown) of the wiring circuit board 1 and a solder ball (not shown) as a "terminal" of the IC package 2. This IC socket 10 is used for a testing apparatus for a conductivity test such as a burn-in test on the IC package 2, for example.

A plurality of spherical solder balls are provided in a matrix shape in a predetermined substantially square range of an undersurface of a substantially square package body 3 of the IC package 2 of the present embodiment.

The present embodiment includes a cooling head 5 (see FIG. 3 or the like) above the IC socket 10, provided for a cooling apparatus (not shown) that cools the IC package 2 under testing and keeps it at a predetermined temperature. The cooling head 5 is configured to move upward/downward between an upper position which is a position not in contact with the IC socket 10 and a lower position which is a position in contact with the IC socket 10.

Figure 3:
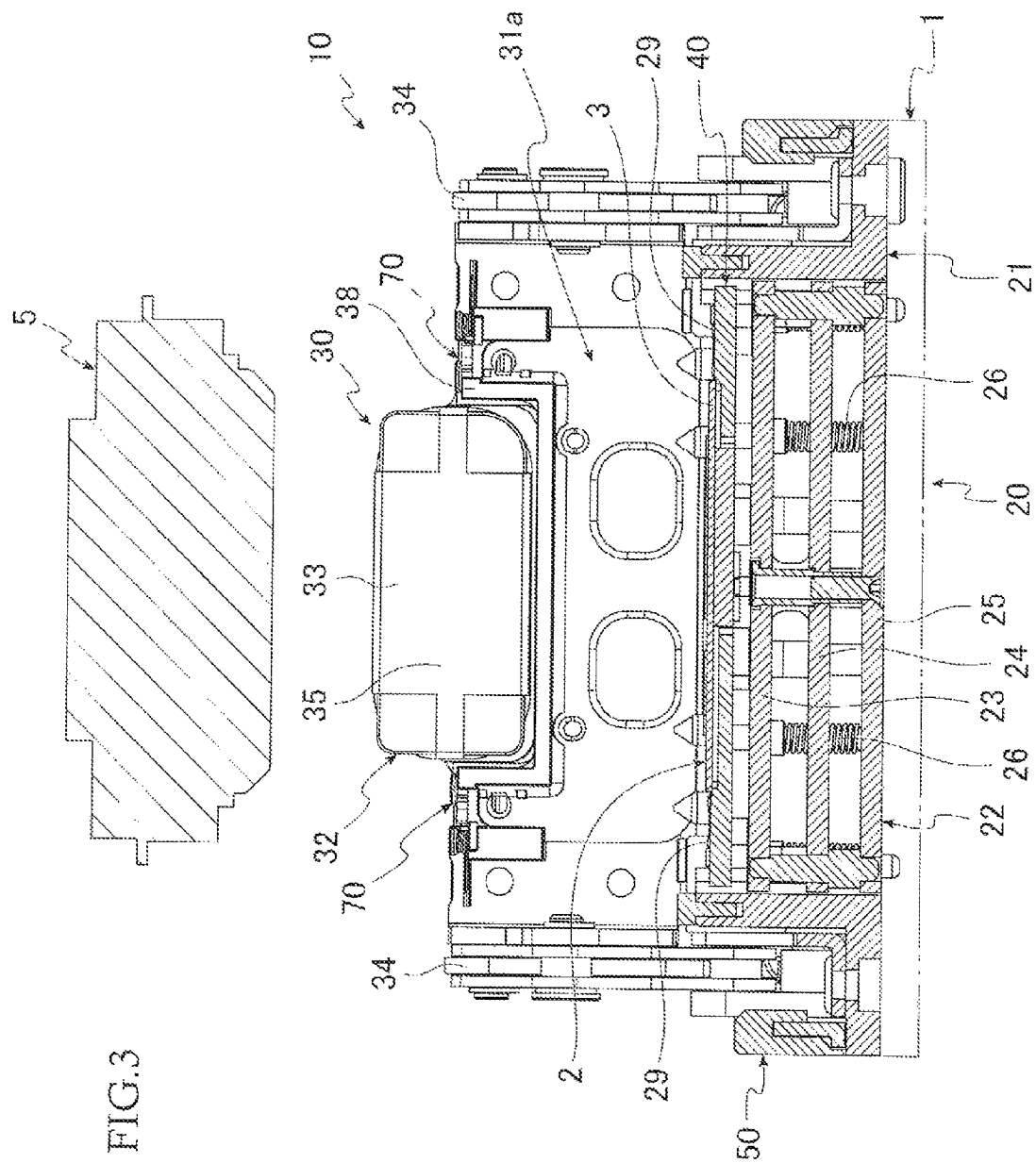
FIG. 3 is an A-A cross-sectional view of the IC socket in FIG. 2 in which an IC package is housed and a cooling head is disposed.
Figure 4:
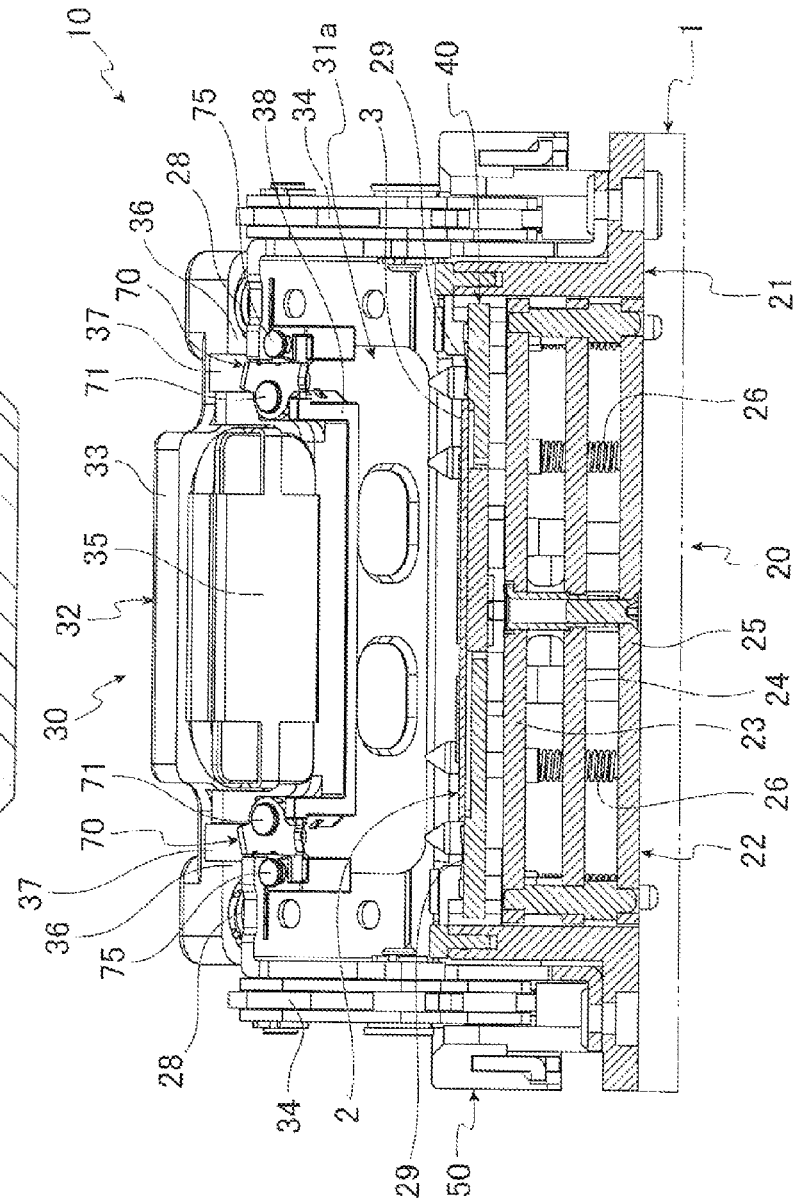
FIG. 4 is a cross-sectional view in the middle of closing the cover member from the state in FIG. 3.

Furthermore, as shown in FIG. 3, the IC socket 10 is provided with a socket body 20 that includes, on a top surface side, a floating plate 40 as a "housing part" disposed on the wiring circuit board 1 that houses the IC package 2, a pair of cover members 30 so as to rotate with respect to the socket body 20 and disposed so as to be able to open/close, and a frame-shaped operation member 50 to operate the rotation of the cover member 30.

The cover member 30 is provided with a heat slug 32 that moves between a position at which the heat slug 32 is in contact with the IC package 2 and a position at which the heat slug 32 is not in contact with the IC package 2, and heat of the IC package 2 is transmitted to the cooling head 5 via the heat slug 32. The IC socket 10 is provided with a restricting mechanism 70 that restricts, when no IC package 2 is housed on the floating plate 40, the movement of the heat slug 32 at a predetermined position to prevent the heat slug 32 from contacting the contact pin 60. Details will be described hereinafter.

Regarding the socket body 20, a contact module 22 is disposed in a rectangular frame-shaped outer frame 21 as shown in FIG. 3. A plurality of contact pins 60 (see FIG. 6 etc.) are arranged in a matrix shape on the contact module 22 and the IC package 2 is housed on the top surface side.

Figure 6:
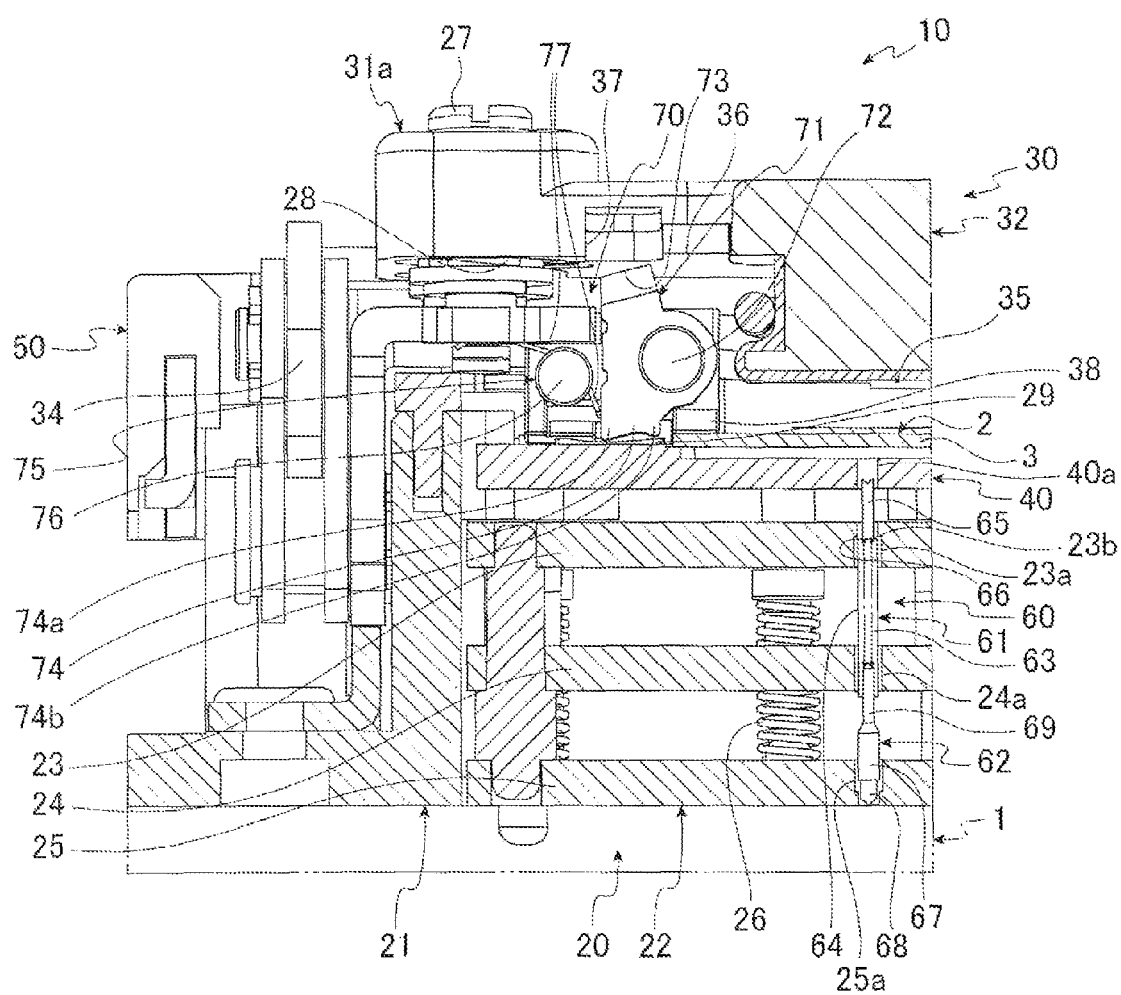
FIG. 6 is a partially enlarged cross-sectional view of FIG. 5.

As shown in FIGS. 3, 6 etc., the contact module 22 is provided with an upper holding member 23, a central holding member 24, a lower holding member 25, the floating plate 40 or the like. The upper holding member 23, the central holding member 24 and the lower holding member 25 are held at a predetermined interval. Above the upper holding member 23, the floating plate 40 is disposed in a state in which the floating plate 40 is urged by a spring 26 to a direction toward an upper side of the socket body 20. This allows the floating plate 40 to move upward/downward with respect to the upper holding member 23, the central holding member 24 and the lower holding member 25 by being held at the predetermined interval.

The contact pins 60 are disposed by being inserted into through holes 23a, 24a, 25a and 40a provided so as to penetrate the upper holding member 23, the central holding member 24, the lower holding member 25 and the floating plate 40 in the upward/downward direction. The contact pins 60 are configured to be able to expand/contract in the upward/downward direction.

As shown in FIG. 6, each contact pin 60 includes a first conductive stepped cylindrical plunger 61, a second conductive stepped cylindrical plunger 62 and a coil spring 63.

The first plunger 61 includes an outer cylindrical part 64 having an inner diameter greater than an outer diameter of the coil spring 63, a first contact part 65 having an inner diameter smaller than an outer diameter of the coil spring 63, and a stepped part 66 that connects the outer cylindrical part 64 and the first contact part 65. The stepped part 66 of the first plunger 61 comes into contact with a step part 23b provided in the through hole 23a of the upper holding member 23 and thereby restricts the upward movement of the contact pin 60. The floating plate 40 moves downward as will be described later, and the first contact part 65 can thereby come into contact with a solder ball of the IC package 2.

The second plunger 62 includes a body part 67 having an outer diameter larger than an inner diameter of the outer cylindrical part 64 of the first plunger 61, a second contact part 68 having an outer diameter smaller than the outer diameter of the body part 67 and an inner contact part 69 having an outer diameter smaller than the inner diameter of the outer cylindrical part 64 of the first plunger 61, and the inner contact part 69 is inserted into the outer cylindrical part 64 of the first plunger 61 so as to be vertically movable. The inner contact part 69 is tapered, with the diameter thereof expanding from a top end (one end on the first plunger 61 side) to a bottom end (the other end on the body part 62 side) and the diameter at the bottom end being larger than the diameter at the top end. The inner contact part 69 is configured to come into contact with an inner surface of the outer cylindrical part 64 and be brought into conduction. The wiring circuit board 1 is disposed at a predetermined position on the undersurface side of the socket body 20, and the second contact part 68 of the second plunger 62 is thereby configured to come into contact with an electrode of the wiring circuit board 1.

The coil spring 63 is inserted into the outer cylindrical part 64 of the first plunger 61, a top end thereof is in contact with the stepped part 66 of the first plunger 61, a bottom end thereof is in contact with one end of the inner contact part 69 of the second plunger 62, thus urging the second plunger 62 downward.

When the IC package 2 is housed on the floating plate 40, the cover member 30, which will be described later, is rotated and closed, the floating plate 40 moves downward so as to approach the upper holding member 23, the central holding member 24 and the lower holding member 25, causing a distal end of the first contact part 65 provided on the first plunger 61 of the contact pin 60 to protrude from the top surface side of the floating plate 40 and come into contact with the solder ball of the IC package 2. Note that although the plurality of contact pins 60 are arranged in a matrix shape with respect to the socket body 20 in the present embodiment as described above, only one contact pin 60 is described in the figure for the sake of convenience.

Figure 2:
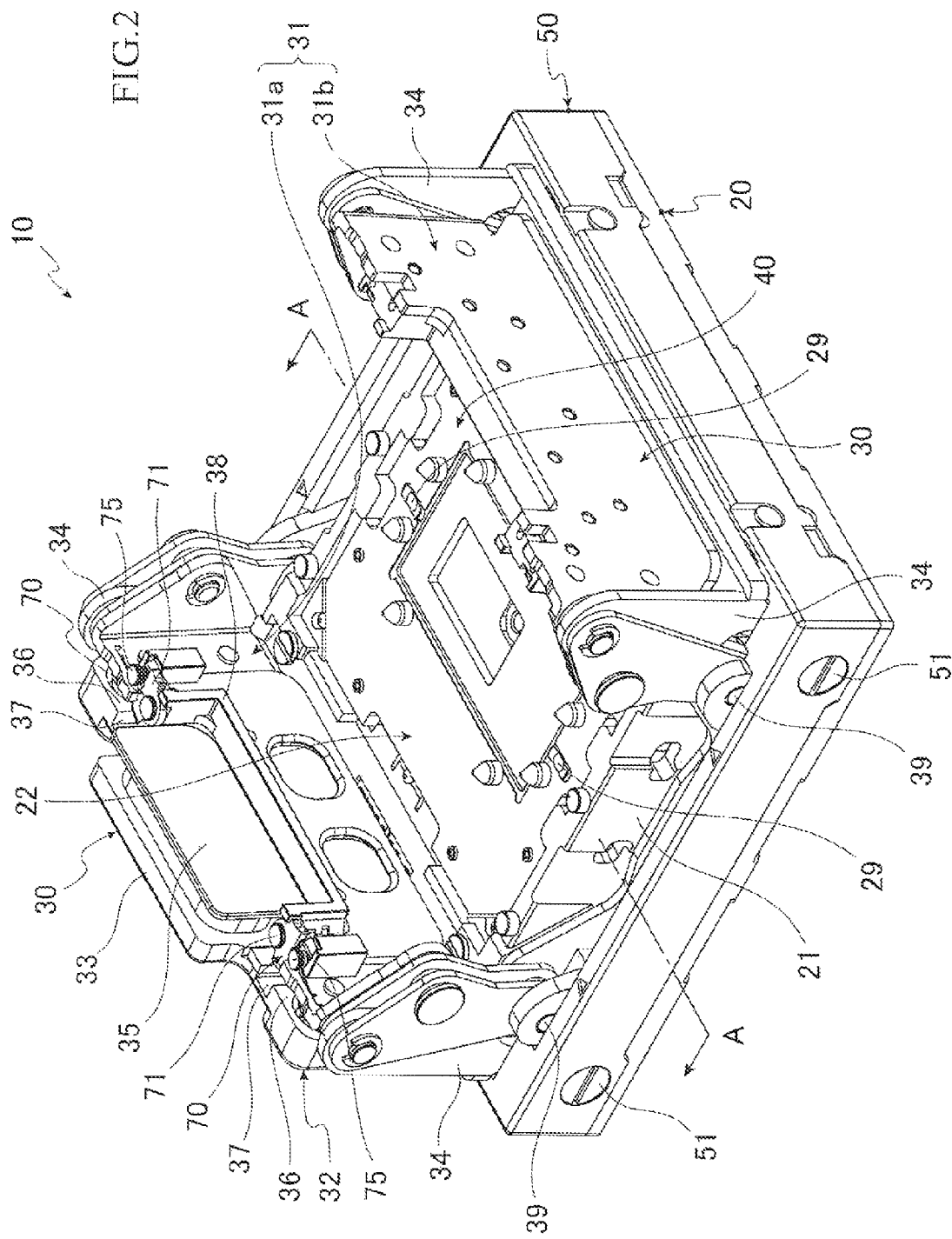
FIG. 2 is a perspective view of the IC socket in an open state according to the embodiment of the present invention.

Furthermore, as shown in FIGS. 1 and 2, the cover member 30 includes a pair of cover member bodies 31 (that is, first and second cover member bodies 31a and 31b) and the heat slug 32 made of a highly thermoconductive material such as metal, provided on one of the cover member bodies 31 (here, the first cover member 31a) and configured to be vertically movable with respect to the cover member body 31. The pair of cover member bodies 31 is attached to both ends of the side face of the socket body 20 so as to be rotatable via rotating shafts 39.

More specifically, the pair of cover member bodies 31 are supported by their respective rotating shafts 39 and disposed so as to sandwich a substantially center of the socket body 20. The first and second cover member bodies 31a and 31b making up the cover member body 31 are configured to open/close outward and upward in a so-called double-swinging door form. Furthermore, one end of a tabular link member 34 that is fixed to the cover member body 31 and rotates together with the cover member body 31 through a rotation operation around the rotating shafts 39 engages with shafts 51 provided in the four corners of the side face of the operation member 50. When the shaft 51 moves upward/downward with the vertical movement of the operation member 50, one end of the link member 34 also moves upward/downward, causing the cover member body 31 to rotate around the rotating shaft 39.

The operation member 50 is urged upward by an urging member (not shown) and if the operation member 50 is pressed and moved downward against the upward urging force by the urging member, the cover member body 31 that engages with the operation member 50 via the link member 34 is configured to rotate upward and outward so that the cover member 30 is placed in an open state. When the downward pressure on the operation member 50 is canceled, the operation member 50 moves upward by the upward urging force of the urging member. Then, the cover member body 31 that engages with the operation member 50 via the link member 34 is configured to rotate downward and inward so that the cover member 30 is placed in a closed state. As a result, the pair of cover member bodies 31 is configured to open/close upward in a so-called double-swinging door form.

A pusher plate 38 is disposed on an undersurface side of the cover member body 31. The pusher plate 38 is a member to press the IC package 2 housed on the floating plate 40 from above when the cover member body 31 is closed and fix the IC package 2 to the floating plate 40. As shown in FIG. 2, the pusher plate 38 according to the present embodiment is disposed in a nearly U-shape so as to surround the periphery of a pressing part 35 (which will be described later) provided on the heat slug 32 on the undersurface side of the cover member body 31 (that is, one first cover member body 31*a* and second cover member body 31*b*).

Furthermore, as shown in FIGS. 1 and 6, the heat slug 32 is disposed so as to be vertically movable with respect to the cover member body 31. More specifically, a plurality of pin members 27 are inserted from an end of the top surface of the heat slug 32 and a pin member coil spring 28 is provided for each pin member 27, which urges the pin member 27 and the heat slug 32 upward with respect to the socket body 20.

When the cover member body 31 is closed, the heat slug 32 is urged upward by the pin member coil spring 28, and the heat slug 32 is urged upward with respect to the cover member body 31, and as a result, the pressing part 35 on the undersurface of the heat slug 32 is located above the floating plate 40 of the socket body 20 by a predetermined amount.

Figure 9:
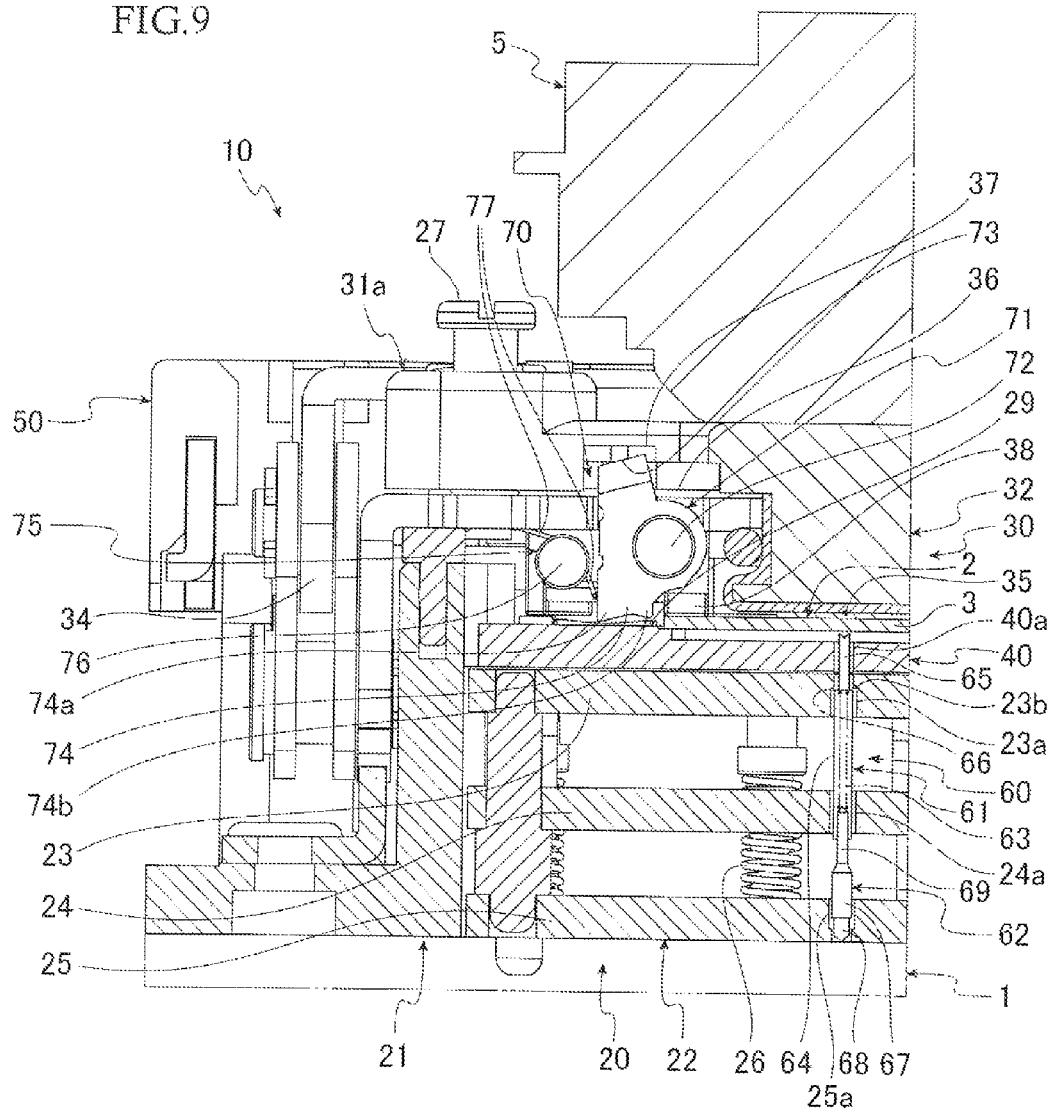
FIG. 9 is a cross-sectional view of a state in which the cooling head presses the heat slug to cause the heat slug to move down to a lowest position from the state in FIG. 8.
Figure 10:
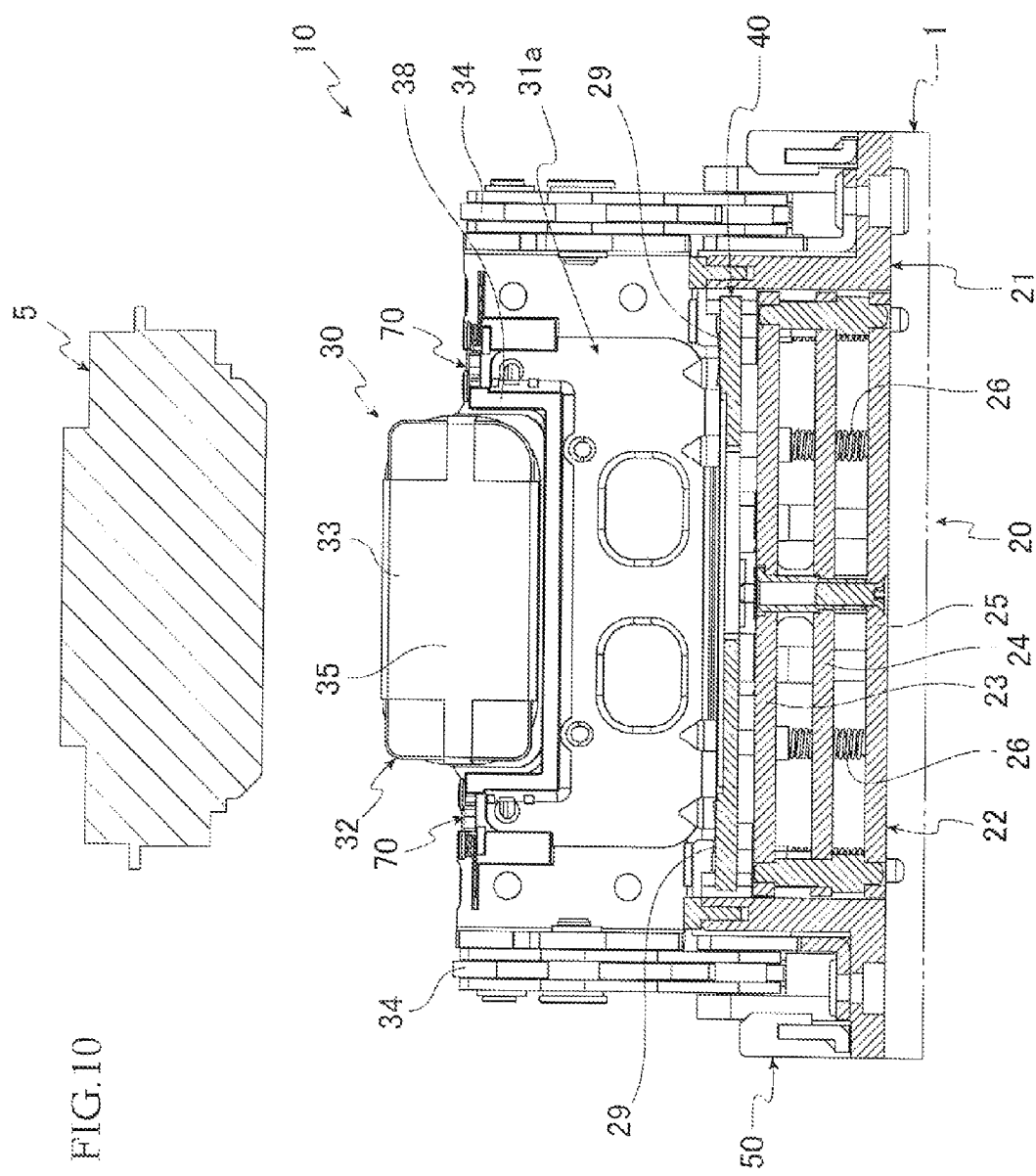
FIG. 10 is an A-A cross-sectional view of a state in which the cooling head is disposed without housing the IC package in the IC socket in FIG. 2.
Figure 11:
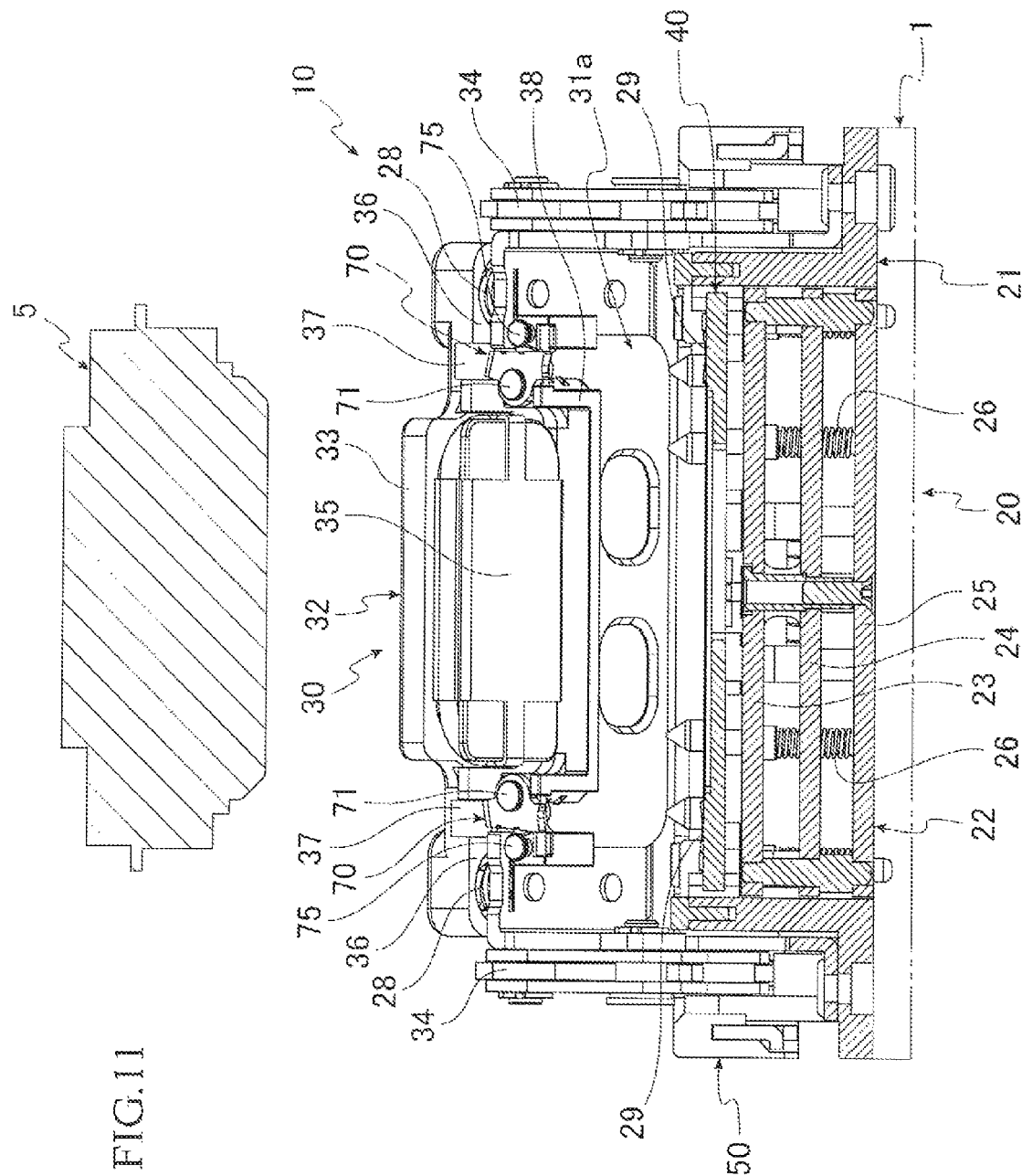
FIG. 11 is a cross-sectional view in the middle of closing the cover member from the state in FIG. 10.
Figure 12:
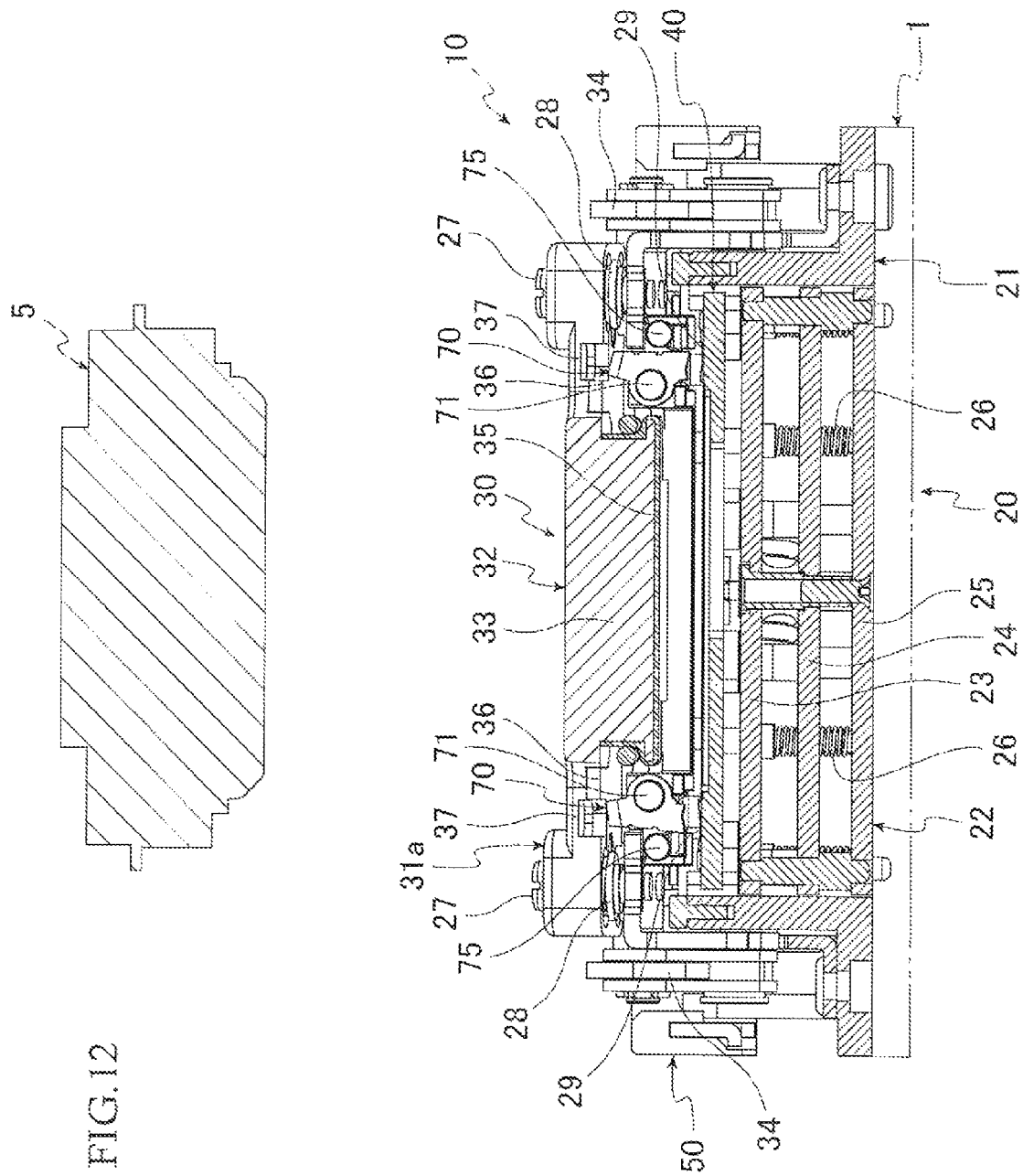
FIG. 12 is a cross-sectional view of a state in which the cover member is further closed from the state in FIG. 11.

As shown in FIG. 9, when the top surface of the heat slug 32 is pressed downward by the cooling head 5, the heat slug 32 is moved downward with respect to the cover member body 31 against the upward urging force by the pin member coil spring 28. As a result, the pressing part 35 on the undersurface of the heat slug 32 is caused to move down to a position that can come into contact with the floating plate 40 of the socket body 20.

Note that as shown in FIGS. 1 and 2, the heat slug 32 is provided on only the first cover member body 31*a* which is one of the pair of cover member bodies 31, and the heat slug 32 has a shape including an overhang part 33 formed so as to overhang on the other second cover member body 31*b* side when the cover member 30 is closed.

Furthermore, as described above, the heat slug 32 moves downward with respect to the cover member body 31, in a state in which the first cover member body 31*a* is closed, when the heat slug 32 comes into contact from above with the cooling head 5 which has moved to a lower position and is pressed from above by the cooling head 5. The pressing part 35 provided on the undersurface of the heat slug 32 comes into contact with the IC package 2 housed on the floating plate 40 and presses the IC package 2. It is thereby possible for the cooling head 5 to cool the IC package 2 via the heat slug 32.

Note that in the present embodiment, the pressing part 35 on the undersurface of the heat slug 32 has a position and a size that the pressing part 35 can press a substantially entire top surface of the IC package 2 housed on the floating plate 40 from above.

Figure 5:
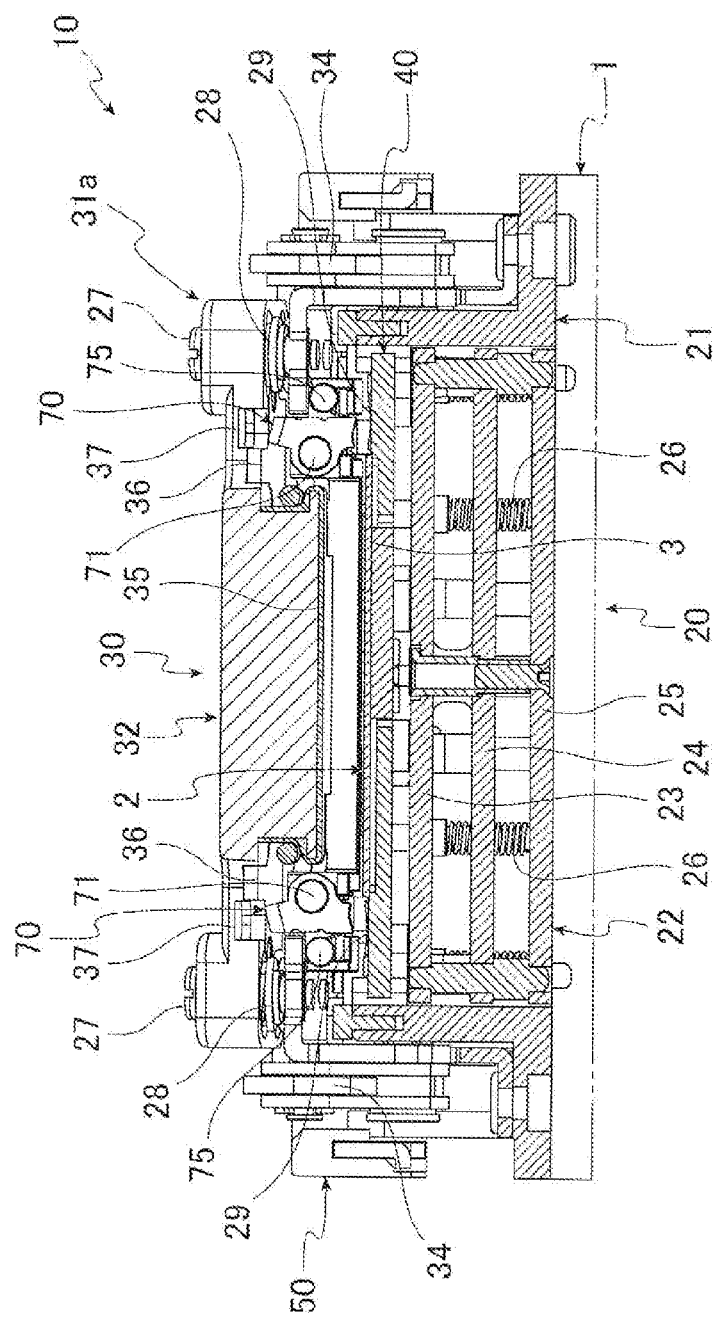
FIG. 5 is a cross-sectional view of a state in which the cover member is further closed from the state in FIG. 4.

Furthermore, as shown in FIGS. 2, 5 and 6, the cover member body 31 is provided with the restricting mechanism 70. The restricting mechanism 70 allows the heat slug 32 to move downward when the IC package 2 is housed on the floating plate 40 of the socket body 20, whereas, when no IC package 2 is housed on the floating plate 40 of the socket body 20, the restricting mechanism 70 prevents the heat slug 32 from moving downward.

To be more specific, the restricting mechanism 70 of the present embodiment is provided on the first cover member body 31*a* of the cover member body 31 as shown in FIG. 2. The restricting mechanism 70 is attached at two locations, on the left and right sides of an opening/closing boundary surface with respect to the second cover member body 31*b* of the first cover member body 31*a*. The restricting mechanism 70 includes a trigger member 71 and an urging member 75. The left and right restricting mechanisms 70 are configured to be arranged in a direction reversed left and right. Note that the right restricting mechanism 70 is the same as the left restricting mechanism 70 except in that the left and right parts are inverted, and therefore the left restricting mechanism 70 will be mainly described and description of the right restricting mechanism 70 will be omitted hereinafter.

Of the configuration of the above-described restricting mechanism 70, the trigger member 71 is configured so as to be rotatable with respect to the first cover member body 31*a* around a shaft 72 formed near a center thereof as shown in FIG. 6. An upper contact part 73 is provided at a top of the trigger member 71 and a lower contact part 74 is provided at a bottom of the trigger member 71.

Furthermore, as shown in FIG. 6, the urging member 75 is made up of a torsion spring or the like wound around a body part 76 and both end portions 77 of the torsion spring protrude from above and a side thereof. The end portions 77 come into contact with part of the first cover member body 31*a* (undersurface side of part of the first cover member body 31*a* in the figure) and the lower part of the trigger member 71 (bottom left side in the figure) so as to urge the trigger member 71 in a predetermined direction (counterclockwise in the figure).

Furthermore, as shown in FIG. 6, a concave part 37 is provided on the undersurface side of an upper wall part 36 of part of the heat slug 32 and configured such that the position where the upper contact part 73 of the trigger member 71 is urged counterclockwise by the urging member 75 is located directly below the concave part 37.

Furthermore, as shown in FIG. 6, the lower contact part 74 of the trigger member 71 is disposed at a position shifted leftward with respect to the shaft 72 and includes a first protrusion part 74*a* on the left side of the undersurface and a second protrusion 74*b* on the right side of the undersurface. The lower contact part 74 is normally stopped by the urging member 75 at a position urged counterclockwise by a predetermined amount. On the other hand, a trigger stopper 29 made up of a metal plate or the like with which the lower contact part 74 is in contact is disposed on the floating plate 40 of the socket body 20. Of the lower contact part 74, the first protrusion part 74a on the left side is located lower than the second protrusion part 74b on the right side.

As shown in FIG. 3 to FIG. 9, in a state in which the IC package 2 is housed on the floating plate 40, when the first cover member body 31a having the heat slug 32 is closed, the pusher plate 38 provided on the first cover member body 31a comes into contact with the top surface of the IC package 2 as shown in FIG. 6 before the lower contact part 74 comes into contact with the trigger stopper 29 of the floating plate 40 of the socket body 20.

Note that the trigger stopper 29 may have a plane shape parallel to the top surface of the floating plate 40, but the part with which the lower contact part 74 comes into contact is inclined in a lower left direction, and when the lower contact part 74 comes into contact with this part, it is readily shifted in the lower left direction, and as a result, the trigger member 71 is likely to rotate clockwise.

Figure 7:
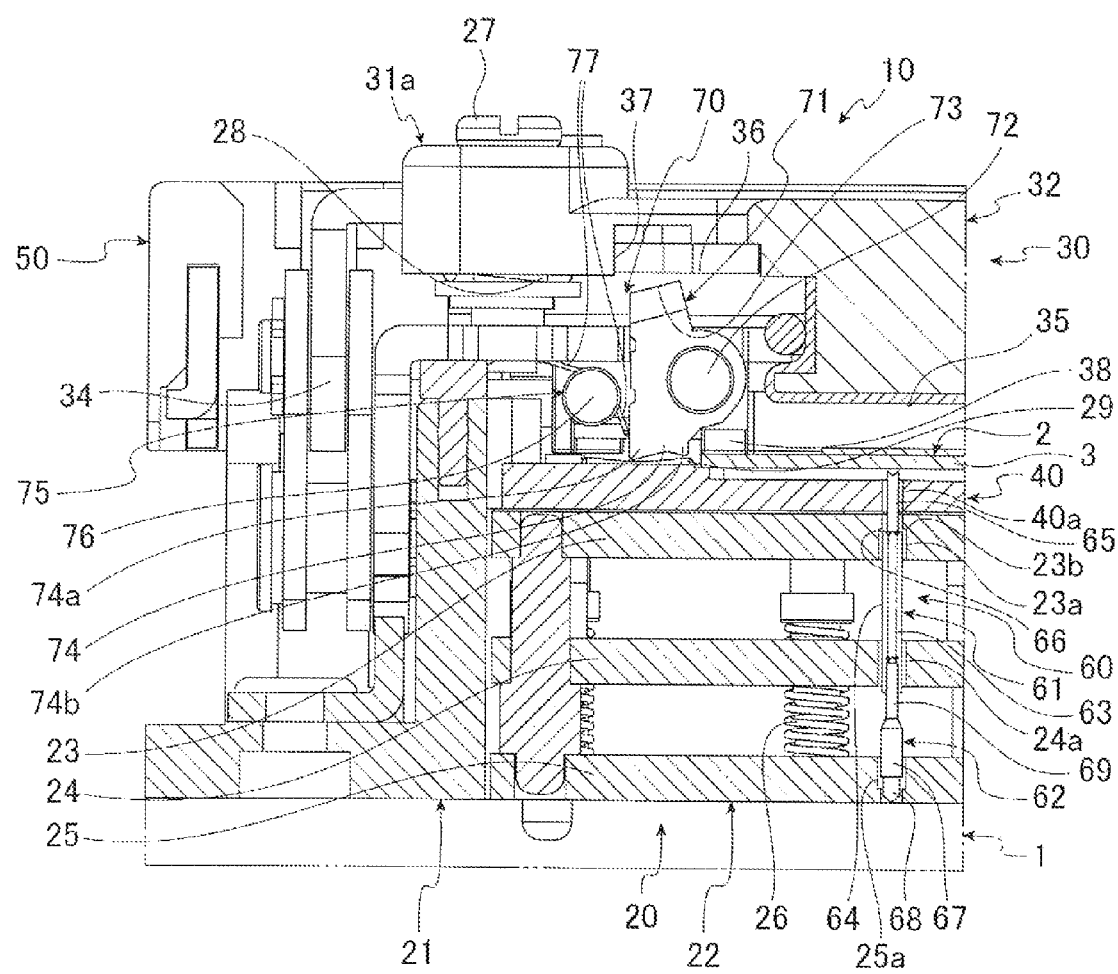
FIG. 7 is a cross-sectional view of a state in which the cover member is further closed from the state in FIG. 6 and the cover member is totally closed.
Figure 8:
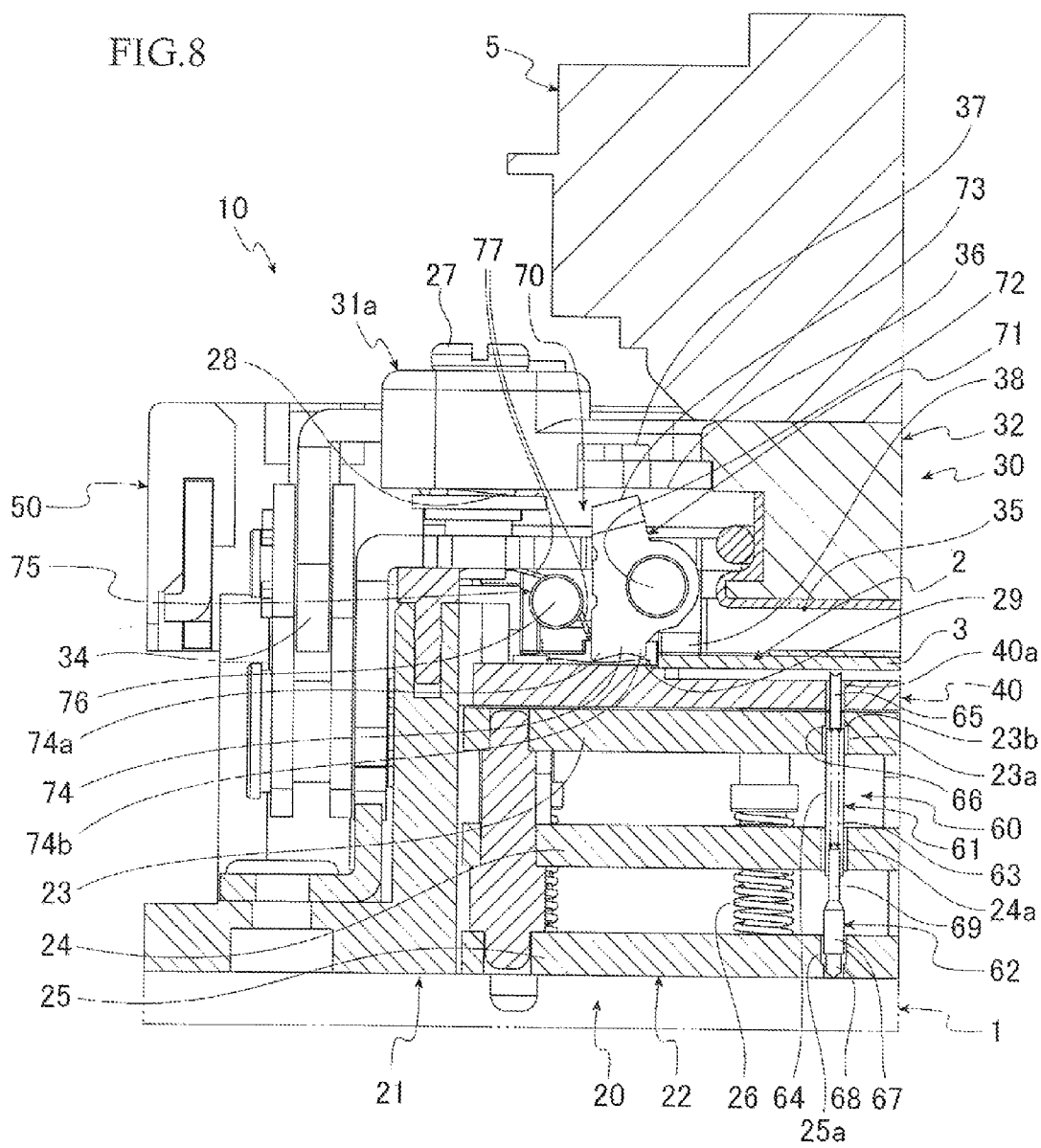
FIG. 8 is a cross-sectional view of a state in which the cooling head is brought into contact with the heat slug of the IC socket in the state in FIG. 7.

As described above, since the pusher plate 38 comes into contact with the IC package 2 and the lower contact part 74 does not come into contact with the trigger stopper 29, as shown in FIG. 6 to FIG. 8, when the first cover member body 31a is closed, the trigger member 71 does not rotate but remains at a position where it is urged counterclockwise by the urging member 75. As a result, as shown in FIG. 7, the upper contact part 73 remains at a position where it is just inserted into the concave part 37 provided in the upper wall part 36 of part of the heat slug 32. This prevents the downward movement of the heat slug 32 from being locked, and so when the heat slug 32 is pressed by the cooling head 5 as shown in FIGS. 8 and 9, the pressing part 35 on the undersurface of the heat slug 32 comes into contact with the IC package 2 from above and further presses the IC package 2. This ensures that the cooling head 5, the heat slug 32 and the IC package 2 come into contact with each other.

Figure 13:
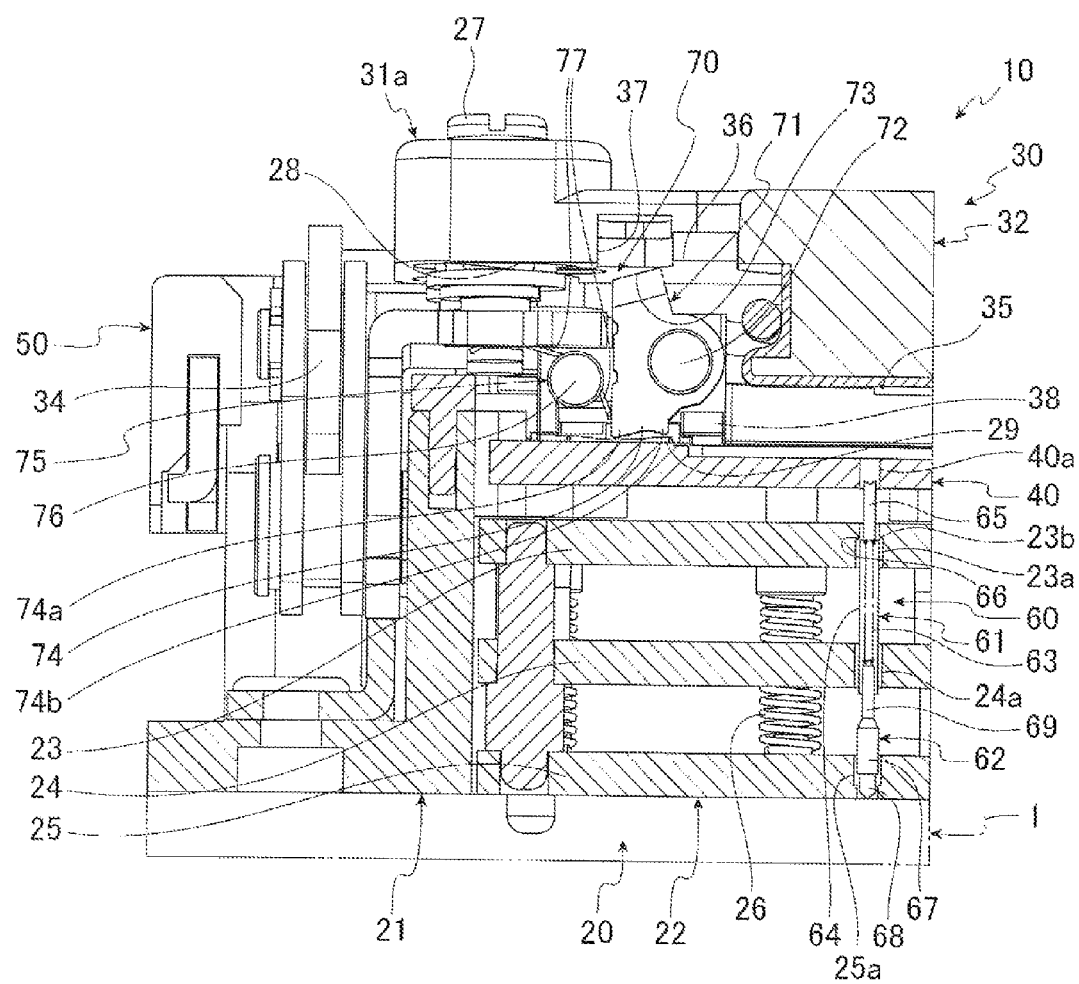
FIG. 13 is a partially enlarged cross-sectional view of FIG. 12.

Furthermore, as shown in FIG. 10 to FIG. 16, in a state in which no IC package 2 is housed on the floating plate 40, since the IC package 2 is absent when the first cover member body 31a including the heat slug 32 is closed, the lower contact part 74 comes into contact with the trigger stopper 29 of the floating plate 40 as shown in FIG. 13 before the pusher plate 38 comes into contact with the floating plate 40.

Figure 14:
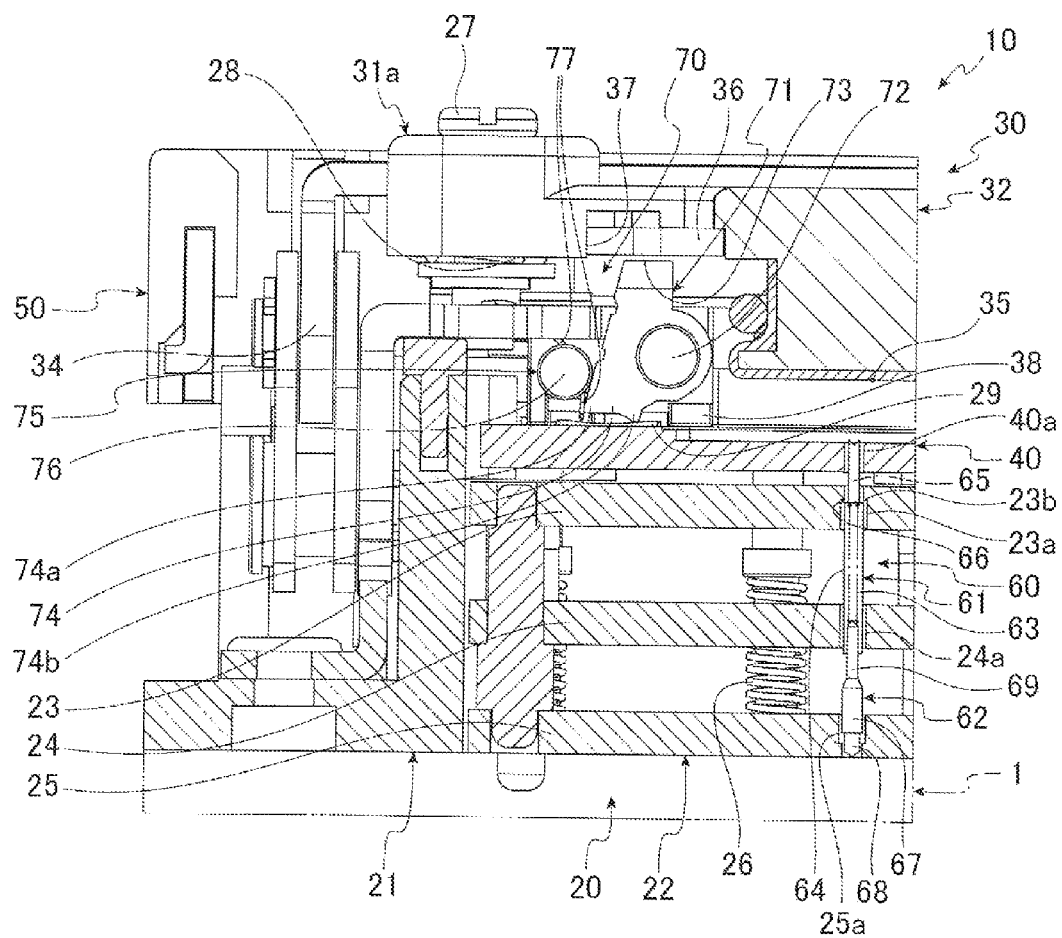
FIG. 14 is a cross-sectional view of a state in which the cover member is further closed from the state in FIG. 13 and the cover member is totally closed.
Figure 15:
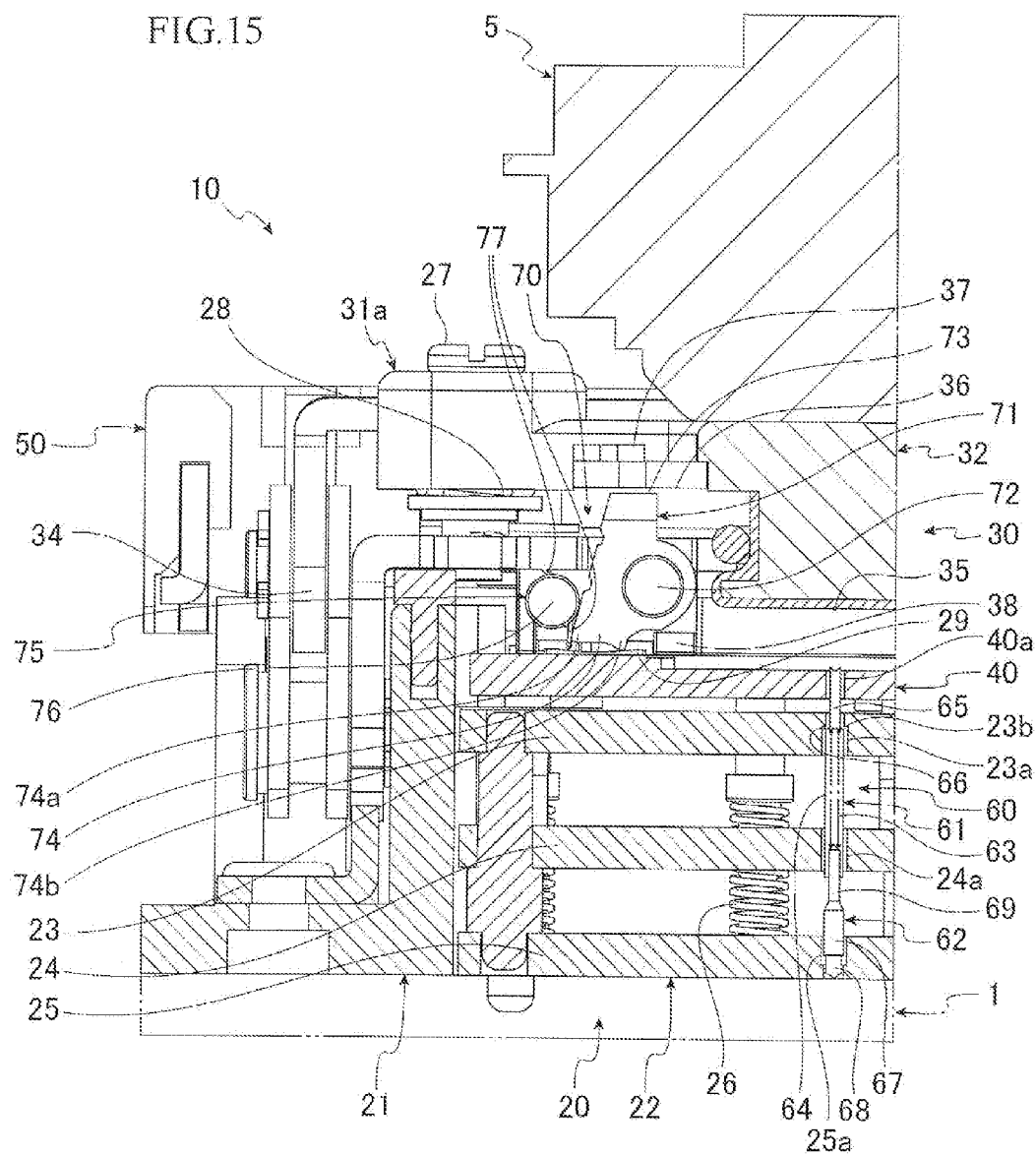
FIG. 15 is a cross-sectional view of a state in which the cooling head is brought into contact with the heat slug of the IC socket in the state in FIG. 14.
Figure 16:
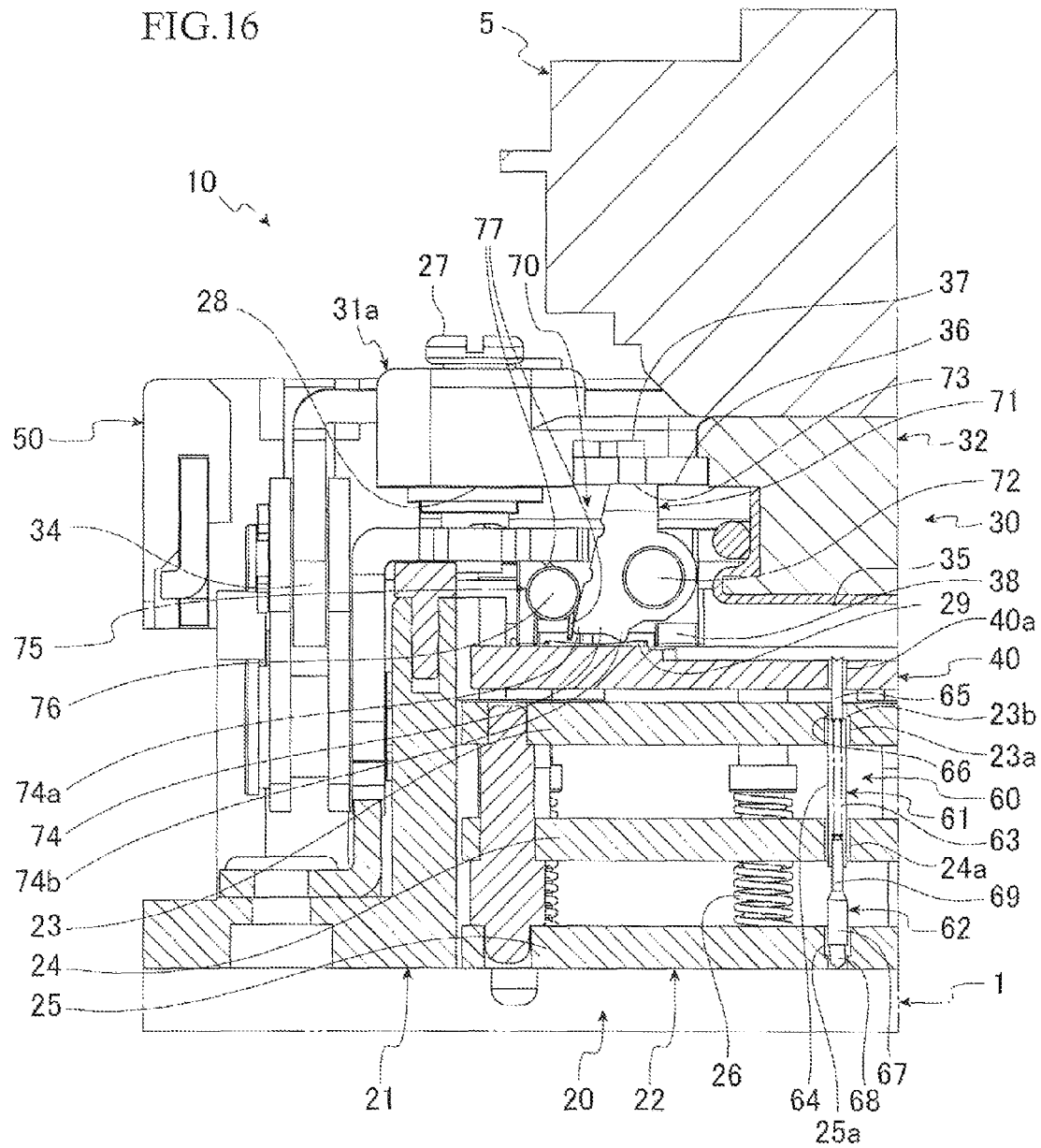
FIG. 16 is a cross-sectional view of a state in which the cooling head presses the heat slug causing the heat slug to move down to the lowest position from the state in FIG. 15.

More specifically, as shown in FIG. 13 first, only the left-side first protrusion part 74a of the lower contact part 74 comes into contact with the trigger stopper 29, whereas the right-side second protrusion 74b does not come into contact with the trigger stopper 29. After that, when the cover member 30 is further closed, the trigger member 71 rotates (rotates clockwise in the figure) around the shaft 72 against the urging force of the urging member 75. Due to the rotation, the right-side second protrusion part 74b also comes into contact with the trigger stopper 29 and further rotates, causing the first protrusion part 74a to separate from the trigger stopper 29 as shown in FIG. 14, with only the second protrusion part 74b remaining in contact with the trigger stopper 29. As a result, as shown in FIG. 14, the upper contact part 73 also rotates clockwise, coming into contact with the upper wall part 36 at a peripheral edge of the concave part 37 without being inserted into the concave part 37 of the heat slug 32 and reaching a position at which it is locked. Thus, when the cooling head 5 presses the heat slug 32, as shown in FIGS. 15 and 16, the heat slug 32 does not move downward from a predetermined position and the pressing part 35 on the undersurface of the heat slug 32 stops at a position where the pressing part 35 is not in contact with the contact pin 60 that protrudes upward from the floating plate 40.

Next, operation of the IC socket 10 provided with the socket body 20 and the cover member 30 will be described.

First, when a conductivity test, such as a burn-in test, of the IC sockets 10 is conducted, a plurality of IC sockets 10 are arranged side by side, and the testing is conducted by housing the IC packages 2 to be tested in some of the IC sockets 10. That is, the testing is conducted on the plurality of IC sockets 10 arranged side by side, where the IC sockets 10 housing the IC package 2 and the IC sockets 10 housing no IC package 2 are mixed.

In each IC socket 10, a plurality of contact pins 60 are disposed in the socket body 20 respectively and the plurality of contact pins 60 are in contact with the corresponding electrodes of the wiring circuit board 1 on the undersurface of the socket body 20 and are electrically connected to the electrodes.

As shown in FIG. 1, the operation member 50 is located at an upper position and in this way, the first cover member body 31a and the second cover member body 31b of the pair of cover members 30 are rotated in a lower inward direction, that is, the cover member 30 is in a closed state.

As shown in FIG. 2, the operation member 50 is pressed using an automatic machine or the like against the urging force of the urging member and moved to a lower position, the first cover member body 31a and the second cover member body 31b of the pair of cover members 30 engaging with each other via the link member 34 are rotated in an upper outward direction, that is, the cover member 30 is in an open state.

The IC package 2 is housed on the floating plate 40 of the IC socket 10 using an automatic machine or the like. After that, the pressure on the operation member 50 is canceled as shown in FIG. 1, the operation member 50 is moved to the upper position by the urging force of the urging member, the first cover member body 31a and the second cover member body 31b engaging with each other via the link member 34 are rotated in a lower inward direction, and the cover member 30 is thereby placed in a closed state.

By this means, the test is conducted with some IC packages 2 being housed in some of the plurality of IC sockets 10, and no IC packages 2 being housed in other IC sockets 10.

Hereinafter, the IC socket 10 in which the IC package 2 is housed will be described using FIG. 3 to FIG. 9. When closing the cover member 30 of the IC socket 10 in which the IC package 2 is housed, in a state in which the upper contact part 73 of the trigger member 71 is located directly below the concave part 37 formed on the upper wall part 36 of the heat slug 32, the first cover member body 31a and the second cover member body 31b including the heat slug 32 is changed from the open state as shown in FIG. 2 to the closed state as shown in FIG. 1. In the middle of that process, before the lower contact part 74 provided in the trigger member 71 of the restricting member 70 disposed in the first cover member body 31a comes into contact with the trigger stopper 29 at the position shown in FIG. 6, the downward moving pusher plate 38 comes into contact with the IC package 2 housed on the floating plate 40.

In this way, since the lower contact part 74 of the trigger member 71 does not contact the trigger stopper 29 as shown in FIGS. 6 and 7, even when the first cover member body 31a is further closed, the trigger member 71 does not rotate and the upper contact part 73 continues to be located directly below the concave part 37 formed in the upper wall part 36 of the heat slug 32.

Note that when the pusher plate 38 presses the IC package 2 downward in the process of closing the first cover member body 31*a*, the floating plate 40 in which the IC package 2 is housed is pressed downward and moves down to a predetermined position. Thus, the distal end of the first contact part 65 provided in the first plunger 61 of the contact pin 60 protrudes from the top surface of the floating plate 40 and comes into contact with a solder ball (not shown) provided in the IC package 2.

After that, as shown in FIGS. 8 and 9, in a state in which the cover member body 31 is closed, when the heat slug 32 is pressed from above by the cooling head 5 to move downward, the upper contact part 73 of the trigger member 71 is inserted into the concave part 37 located thereabove which is formed on the upper wall part 36 in the heat slug 32. This prevents the downward movement of the heat slug 32 from being locked and causes the heat slug 32 to continue to move down to a predetermined position.

As a result, when all the cooling heads 5 corresponding to the IC sockets 10 during testing are caused to move downward, come into contact with all the heat slugs 32 and pressed downward, it is possible to cause the unlocked heat slugs 32 of the IC socket 10 to move downward, cause the heat slugs 32 to come into contact with and press the IC packages 2, and cool the IC packages 2 through the cooling heads 5 via the heat slugs 32.

Note that in the present embodiment, the plurality of disposed IC sockets 10 are provided with their respective cooling heads 5. All the cooling heads 5 perform pressing or pressure releasing under the same control. That is, all the cooling heads 5 are configured to operate simultaneously. However, for the reason below, the cooling head 5 can perform operation of pressing the heat slug 32 to move down to a predetermined position for only those of the IC sockets 10 in which the IC packages 2 are housed.

Next, the IC socket 10 in which no IC package 2 is housed will be described using FIG. 10 to FIG. 16. When closing the cover member 30 of the IC socket 10 in which no IC package 2 is housed, in a state in which the upper contact part 73 of the trigger member 71 is located directly below the concave part 37 formed in the upper wall part 36 of the heat slug 32, the first cover member body 31*a* and the second cover member body 31*b* including the heat slug 32 are changed from the open state as shown in FIG. 2 to the closed state as shown in FIG. 1. In the middle of that process, since the IC package 2 is not housed at the position shown in FIG. 13, if the first cover member body 31*a* and the second cover member body 31*b* are further closed, the pusher plate 38 comes into contact with the floating plate 40 in a state in which the heat slug 32 can move downward. However, before the pusher plate 38 comes into contact with the floating plate 40 of the first socket member body 31*a*, the left-side first protrusion part 74*a* of the lower contact part 74 provided in the trigger member 71 of the restricting mechanism 70 disposed on the first cover member body 31*a* comes into contact with the trigger stopper 29.

Here, when the first cover member body 31*a* including heat slug 32 is further rotated in a closing direction, the first protrusion part 74*a* of the lower contact part 74 moves along the leftward slope of the trigger stopper 29 against the counterclockwise urging force of the urging member 75, which causes the trigger member 71 to rotate clockwise around the rotation part 72. Furthermore, when the first cover member body 31*a* including the heat slug 32 is caused to rotate in a closing direction, the trigger member 71 further rotates clockwise and the right-side second protrusion part 74*b* also comes into contact with the trigger stopper 29.

When the first cover member body 31*a* including the heat slug 32 is caused to move downward in a closing direction, as shown in FIG. 14, the first protrusion part 74*a* and the second protrusion part 74*b* of the lower contact part 74 move along the leftward slope of the trigger stopper 29 against the counterclockwise urging force of the urging member 75, and the trigger member 71 thereby further rotates clockwise, the first protrusion part 74*a* separates from the trigger stopper 29 and only the second protrusion part 74*b* remains in contact with the trigger stopper 29. In accordance with such a movement of the trigger member 71, the upper contact part 73 of the trigger member 71 rotates up to a position facing the upper wall part 36 at the peripheral edge of the concave part 37 located thereabove which is provided in the heat slug 32 so as to be able to contact the upper wall part 36. As shown in FIG. 14, this locks the downward movement of the heat slug 32, preventing the heat slug 32 from further moving downward.

Note that the pusher plate 38 comes into contact with the floating plate 40 in the middle of the process in which the lower contact part 74 of the trigger member 71 comes into contact with the trigger stopper 29 and rotates clockwise. The pusher plate 38 presses the floating plate 40 downward in the process in which the first cover member body 31*a* is closed, and the floating plate 40 thereby moves down to a predetermined position. Accordingly, the distal end of the first contact part 65 in the first plunger 61 of the contact pin 60 protrudes from the top surface of the floating plate 40.

After that, as shown in FIGS. 15 and 16, in a state in which the cover member body 31 is closed, when the cooling head 5 presses the heat slug 32 from above to move downward, the upper contact part 73 of the trigger member 71 comes into contact with and locks the upper wall part 36 of the heat slug 32. Thus, the heat slug 32 does not move downward from its position and the pressing part 35 of the undersurface of the heat slug 32 stops at a position at which it does not come into contact with the distal end of the first contact part 65 in the first plunger 61 of the contact pin 60 that protrudes upward from the floating plate 40.

As a result, it is possible to prevent the heat slug 32 from contacting the contact pin 60 that protrudes from the top surface of the floating plate 40. This makes it possible to prevent the heat slug 32 from damaging the contact pin 60 of the IC socket 10 in a state in which no IC package 2 is housed or prevents a foreign substance from adhering to the first contact part 65 of the contact pin 60.

Thus, in the configuration of the IC socket 10 according to the present embodiment in which the IC package 2 housed on the floating plate 40 is pressed by the cooling head 5 via the heat slug 32, since the restricting mechanism 70 is provided, the heat slug 32 is not locked so as to allow the heat slug 32 to move downward in a state in which the IC package 2 is housed on the floating plate 40 in the process of closing the cover member 30, the heat slug 32 presses the IC package 2, whereas in a state in which no IC package 2 is housed on the floating plate 40, the heat slug 32 is locked so as to prevent the heat slug 32 from moving downward and the heat slug 32 stops at a position at which it does not contact the contact pin 60. For this reason, the floating plate 40 on which no IC package 2 is housed can reliably prevent, using a simple mechanism, problems such that the downward moving heat slug 32 may contact the contact pin 60, damage the contact pin 60 or a foreign substance may adhere to the first contact part 65 of the contact pin 60. As a result, it is possible to improve durability of the IC socket 10.

Note that in order to prevent the heat slug from moving downward from a predetermined position, the present embodiment uses the restricting mechanism including the rotating trigger member, the urging member that urges the rotating trigger member in one rotating direction, and the trigger stopper disposed on the floating plate, but the present embodiment is not limited to this, and a restricting mechanism in any other configuration may also be used if the heat slug is caused to move downward in the IC socket in which the IC package 2 is housed and allowed to contact the IC package and the heat slug is prevented from moving downward so as to prevent the heat slug from contacting the contact pin in the IC socket in which no IC package 2 is housed.

Furthermore, in the present embodiment, the cover member includes a pair of cover member bodies that open/close in a so-called double-swinging door form, but the cover member is not limited to this. For example, the cover member may be constructed of a member which opens/closes through a movement other than the double-swinging door form, or the cover member may be constructed of one or three or more movable members.

Furthermore, according to the present embodiment, substantially the entire heat slug is made of a member having high thermal conductivity, but the heat slug is not limited to this, and the heat slug may be composed appropriately, for example, of only a portion contacting the cooling head and the IC package and a portion connecting them being made of a member having high thermal conductivity and the rest of the heat slug being made of different members.

In the present embodiment, the terminal of the IC package is made up of a solder ball, but the terminal is not limited to this, and the present invention may be applied to an IC package including a terminal of another shape such as a tabular terminal.

The contact pin of the present invention is not limited to a contact pin having a structure similar to that of the present embodiment, but may be one having another structure such as a contact pin formed into a tabular spring shape.

In the present embodiment, the "socket for an electric component" of the present invention is applied to an IC socket, but the present invention is not limited to this, and the present invention is also applicable to other electric components.

REFERENCE SIGNS LIST 1 wiring circuit board
2 IC package (electric component)
5 cooling head
10 IC socket (socket for electric component)
20 socket body
30 cover member
31 cover member body
31a first cover member body
31b second cover member body
326 heat slug
36 upper wall part
40 floating plate (housing part)
60 contact pin
70 restricting mechanism
71 trigger member
73 upper contact part
74 lower contact part
74a first protrusion part
74b second protrusion part
75 urging member

The invention claimed is:

1. A socket for an electric component comprising:
a socket body which is disposed on a wiring circuit board and provided with a housing part to house an electric component on a top surface of the housing part, a contact pin to electrically connect an electrode of the wiring circuit board and a terminal of the electric component is disposed on the housing part,
a cover member disposed so as to be able to open or close with respect to the socket body,
wherein, the cover member comprises a cover member body and a heat slug disposed on the cover member body and contact with the electric component housed to the housing part in a state in which the cover member is closed,
the heat slug is configured to be pressed from above by a cooling head in a state in which the cover member is closed and caused to move downward with respect to the cover member body so as to press the electric component, and
the cover member comprises a restricting mechanism that allows, in a state in which the electric component is housed in the housing part, the cooling head to cause the heat slug to move downward to press the electric component and prevents, in a state in which no electric component is housed in the housing part, the cooling head from causing the heat slug to move downward.

2. The socket for an electric component according to claim 1, wherein the restricting mechanism comprises:
a trigger member disposed the cover member body so as to be movable with respect to the cover member body;
an urging member that urges the trigger member in a first direction to keep the trigger member at a position where the heat slug is allowed to move downward; and
a trigger stopper that moves, when the cover member body further moves downward by a predetermined distance from a lowest downward moving position when the electric component is housed in the housing part in a process in which the cover member is closed, the trigger member in a second direction which is opposite to the first direction against an urging force of the urging member to thereby cause the trigger member to prevent the heat slug from moving downward.

3. The socket for an electric component according to claim 2, wherein;
the heat slug comprises a concave part to insert an upper contact part of the trigger member,
the trigger stopper comprises a slope to rotate the trigger member when the trigger stopper comes into contact with a lower contact part of the trigger member,
the cover member reaches a lowest downward moving position when the electric component is housed in the housing part, without the lower contact part of the trigger member contacting the slope of the trigger stopper with the upper contact part facing the concave part,
the lower contact part of the trigger member rotates and moves in contact with the slope of the trigger stopper when no electric component is housed in the housing part, and the cover member reaches the lowest downward moving position after the upper contact part reaches a position facing a surface outside a peripheral edge of the concave part.

4. The socket for an electric component according to claim 3, further comprising a pusher plate that is provided on an undersurface of the cover member body, comes into contact with a peripheral portion of the electric component from above when the electric component is housed in the housing part, and comes into contact with a top surface of the housing part when no electric component is housed in the housing part, wherein the lowest downward moving position of the cover member is defined by the pusher plate.

5. The socket for an electric component according to claim 1, wherein;

the housing part is a floating plate disposed so as to be movable upward/downward with respect to the socket body, the floating plate comprises a through hole into which a first contact part of the contact pin is inserted, and in a state in which the electric component is housed in the floating plate, when the restricting mechanism moves downward and presses the floating plate, a pressing force thereof causes the floating plate to move downward, the first contact part of the contact pin comes into contact with a terminal of the electric component, then the cooling head presses the heat slug to move downward, the heat slug thereby comes into contact with the electric component, whereas in a state in which no electric component is housed in the floating plate, when the restricting mechanism moves downward and presses the floating plate, the pressing force causes the restricting mechanism to be switched to a state in which the restricting mechanism prevents the heat slug from moving downward, and the restricting control mechanism prevents the heat slug from moving downward when the cooling head presses the heat slug so that the heat slug does not come into contact with the first contact part of the contact pin.

* * * * *

UNITED STATES PATENT AND TRADEMARK OFFICE
CERTIFICATE OF CORRECTION

PATENT NO.       : 9,807,909 B1
APPLICATION NO.  : 15/506540
DATED            : October 31, 2017
INVENTOR(S)      : Shin Kobayashi It is certified that error appears in the above-identified patent and that said Letters Patent is hereby corrected as shown below:

In the Claims

Column 14, Line 26, In Claim 2, after "disposed" insert -- on --.

Column 15, Line 25, In Claim 5, after "restricting" delete "control".

Signed and Sealed this
Ninth Day of January, 2018

Joseph Matal
*Performing the Functions and Duties of the
Under Secretary of Commerce for Intellectual Property and
Director of the United States Patent and Trademark Office*